United States Patent
Kim et al.

(10) Patent No.: US 10,727,839 B2
(45) Date of Patent: Jul. 28, 2020

(54) CLOCK RECOVERY DEVICE AND SOURCE DRIVER FOR RECOVERING EMBEDDED CLOCK FROM INTERFACE SIGNAL

(71) Applicant: SILICON WORKS CO., LTD., Daejeon (KR)

(72) Inventors: Byung-Guk Kim, Daejeon (KR); Hyun Kyu Jeon, Daejeon (KR)

(73) Assignee: SILICON WORKS CO., LTD., Daejeon (KR)

( * ) Notice: Subject to any disclaimer, the term of this patent is extended or adjusted under 35 U.S.C. 154(b) by 0 days.

(21) Appl. No.: 16/459,353

(22) Filed: Jul. 1, 2019

(65) Prior Publication Data
US 2020/0014391 A1 Jan. 9, 2020

(30) Foreign Application Priority Data
Jul. 3, 2018 (KR) .................. 10-2018-0076950

(51) Int. Cl.
*G06F 3/038* (2013.01)
*H03L 7/08* (2006.01)
*G06F 3/14* (2006.01)
*H03K 5/135* (2006.01)

(52) U.S. Cl.
CPC .......... *H03L 7/0807* (2013.01); *G06F 3/1407* (2013.01); *H03K 5/135* (2013.01)

(58) Field of Classification Search
CPC ...... H03L 7/0807; H03K 5/135; G06F 3/1407
See application file for complete search history.

(56) References Cited

U.S. PATENT DOCUMENTS

| | | | |
|---|---|---|---|
| 6,172,686 B1 | 1/2001 | Mizutani | |
| 8,565,362 B2 | 10/2013 | Kim | |
| 2009/0167750 A1* | 7/2009 | Hong | G09G 3/2096 345/213 |
| 2010/0309182 A1* | 12/2010 | Kim | G09G 3/3611 345/208 |
| 2016/0104401 A1* | 4/2016 | Ko | G09G 3/006 345/214 |
| 2016/0163291 A1* | 6/2016 | Amirkhany | G09G 5/18 345/530 |

FOREIGN PATENT DOCUMENTS

JP 4559788 B 10/2010

* cited by examiner

*Primary Examiner* — Dac V Ha
(74) *Attorney, Agent, or Firm* — Fenwick & West LLP

(57) ABSTRACT

In generating a mask signal to be used when a clock signal embedded in an interface signal is recovered, the mask signal may be generated by compensating for a processing delay time occurring in a mask signal generation circuit, thereby reducing the inaccuracy of the mask signal due to the processing delay time.

15 Claims, 10 Drawing Sheets

CLOCK RECOVERY DEVICE AND SOURCE DRIVER FOR RECOVERING EMBEDDED CLOCK FROM INTERFACE SIGNAL

CROSS REFERENCE TO RELATED APPLICATION

This application claims priority from Republic of Korea Patent Application No. 10-2018-0076950, filed on Jul. 3, 2018, which is hereby incorporated by reference in its entirety.

BACKGROUND

1. Field of Technology

The embodiment relates to a technique for recovering an embedded clock from an interface signal.

2. Description of the Prior Art

At least two devices can exchange information through an interface signal.

The interface signal is divided into a plurality of unit times, and a value for a field may be recorded for each unit time. Such a field is also referred to as a bit. When recognizing the interface signal by dividing the interface signal into each unit time, a reception device can read the value of each bit received through the interface signal.

In order to divide the interface signal into each unit time, a clock signal indicating each unit time is required. The clock signal can be transmitted from a transmission device to a reception device together with the interface signal.

The interface signal containing the value of each field can be transmitted and received via a separate line from the clock signal. The reception device may receive the interface signal through a first line, receive the clock signal through a second line, and use the clock signal to recognize the interface signal by dividing the interface signal into each unit time portions, thereby obtaining data from the interface signal.

However, if the interface signal and the clock signal are constituted by separate lines, a problem of electromagnetic interference (EMI) in which a clock signal and an interface signal interfere with each other may occur, a problem of data sampling error may occur due to a difference in transmission delay of each line, and a problem of space allocation may occur due to an increase in the number of lines.

In order to solve the above-mentioned problems, the transmission/reception device can transmit/receive a clock signal embedded in an interface signal. This can alleviate the problem of EMI, the problem of data sampling error, and the problem of space allocation.

In an embedded clock scheme in which a clock signal is embedded in an interface signal, the clock signal may be inserted into some time intervals of the interface signal, and transmitted and received. The reception device can extract the clock signal from the interface signal by using a mask signal indicating the time interval into which the clock signal is inserted.

A mask signal generation circuit may generate a mask signal to indicate a time interval containing a portion into which the clock signal is inserted. However, when the mask signal generation circuit generates the mask signal, there may arise a problem that the time interval of the portion into which the clock signal is inserted cannot be accurately indicated due to a processing delay time of a logic circuit.

For example, the clock signal may not be included in the time interval indicated by the mask signal in the interface signal, or a data signal or a dummy signal may be included in the corresponding time interval. In this case, the reception device cannot recover the clock signal from the interface signal, or the transmission device may generate a clock signal having a characteristic different from that of the intended clock signal.

SUMMARY

Given this background, an aspect of the present disclosure is to provide a technique for accurately recovering a clock signal from an interface signal.

In accordance with an aspect of the present disclosure, a clock recovery device includes: a mask signal generation unit configured to generate a mask signal in accordance with a first mask reference signal; a mask duplication signal generation unit configured to generate a mask duplication signal in accordance with a second mask reference signal; a clock extraction unit configured to generate an extraction clock through a signal in a time interval indicated by the mask signal in an interface signal with a clock signal embedded therein; a first time-delay control unit configured to generate a compensation clock by time-delaying the extraction clock and to control a time delay of the extraction clock so that a phase difference between the extraction clock and the mask duplication signal becomes smaller; and a second time-delay control unit configured to generate a plurality of data clock signals, the first mask reference signal, and the second mask reference signal by time-delaying the compensation clock, and to generate the first mask reference signal and the second mask reference signal so that a phase of the first mask reference signal is ahead of a phase of the second mask reference signal.

In the clock recovery device, the mask signal generation unit may generate a rising edge of the mask signal in accordance with the first mask reference signal through a first internal circuit, the mask duplication signal generation unit may generate a rising edge of the mask duplication signal in accordance with the second mask reference signal through a second internal circuit, and a processing delay time of the first internal circuit and a processing delay time of the second internal circuit may correspond to a difference within a predetermined time.

In the clock recovery device, one period of the interface signal may be divided into a plurality of unit times in which information is divided, and the phase of the first mask reference signal may be ahead of the phase of the second mask reference signal by 0.5 unit times.

In the clock recovery device, the first time-delay control unit may include a delay circuit configured to output the compensation clock by time-delaying the extraction clock and to adjust a degree of time delay in accordance with a voltage control signal, and a phase difference feedback unit configured to generate the voltage control signal corresponding to the phase difference between the extraction clock and the mask duplication signal to output the generated voltage control signal to the delay circuit.

In the clock recovery device, the mask signal generation unit may generate a rising edge of the mask signal in accordance with the first mask reference signal, and may generate a falling edge of the mask signal in accordance with the extraction clock or a signal obtained by delaying the extraction clock by a predetermined time.

In the clock recovery device, the second time-delay control unit may include a delay circuit configured to generate a plurality of data clock signals having different phases by time-delaying the compensation clock through a plurality of delay means connected in serial and to adjust a degree of time delay of each delay means in accordance with a voltage control signal, and a phase difference feedback unit configured to generate the voltage control signal corresponding to a phase difference between one data clock signal and another data clock signal through a predetermined number of the delay means in the one data clock signal to output the generated voltage control signal to each delay means.

In the clock recovery device, one period of the interface signal may be divided into a plurality of unit times in which information is divided, and the delay means may delay the time by 0.5 unit times.

In the clock recovery device, the interface signal may include a dummy signal interval and a clock signal interval, and a rising edge of the mask signal may be located in the dummy signal interval and a falling edge thereof may be located in the clock signal interval.

In the clock recovery device, the phase of the first mask reference signal may be ahead of the phase of the second mask reference signal by a time corresponding to a half of the dummy signal interval.

In accordance with another aspect of the present disclosure, a clock recovery device includes: a mask signal generation unit configured to generate a mask signal using a first mask reference signal; a mask duplication signal generation unit configured to generate a mask duplication signal using a second mask reference signal; a clock extraction unit configured to generate an extraction clock through a signal in a time interval indicated by the mask signal in an interface signal with a clock signal embedded therein; a first time-delay control unit configured to generate a compensation clock by time-delaying the extraction clock and to control a time delay of the extraction clock so that a phase difference between a signal of a portion corresponding to the clock signal in the interface signal and the mask duplication signal becomes smaller; and a second time-delay control unit configured to generate a plurality of data clock signals, the first mask reference signal, and the second mask reference signal by time-delaying the compensation clock and to generate the first mask reference signal and the second mask reference signal so that a phase of the first mask reference signal is ahead of a phase of the second mask reference signal.

In accordance with another aspect of the present disclosure, a source driver includes: a signal reception unit configured to receive a display signal with a clock signal embedded therein; a clock recovery unit configured to generate a plurality of data clock signals by recovering the clock signal from the display signal; and a data driving unit configured to extract image data from the display signal in accordance with the plurality of data clock signals and to drive pixels disposed on a panel in accordance with the image data.

In the source driver, the clock recovery unit may generate an extraction clock through a time interval indicated by a mask signal in the display signal, may generate a compensation clock by time-delaying the extraction clock, may generate the plurality of data clock signals and the mask signal using the compensation clock, and may control a time delay for the extraction clock so that the mask duplication signal delayed in time by a predetermined time with the mask signal is synchronized in phase with the extraction clock.

In the source driver, one period of the display signal may be divided into a plurality of unit times in which information is divided, and the mask duplication signal may have a time delay within one unit time with the mask signal.

In the source driver, the clock recovery unit may include a mask signal generation unit configured to generate the mask signal in accordance with a first mask rising signal, and a mask duplication signal generation unit configured to generate the mask duplication signal in accordance with a second mask rising signal delayed in time by a predetermined time from the first mask rising signal.

In the source driver, the mask duplication signal generation unit may include the same logic circuit as that of the mask signal generation unit.

In the source driver, the display signal may be a serial signal, and the data driving unit may include a serial/parallel conversion unit configured to convert a portion for the image data in the display signal into parallel data.

As described above, according to embodiments, the clock signal can be accurately recovered from the interface signal. As an example, according to embodiments, it is possible to accurately recover the clock signal from the interface signal by allowing a mask signal to accurately indicate a portion into which the clock signal is inserted in the interface signal with the clock signal embedded therein. As another example, according to the embodiments, it is possible to generate a mask signal by compensating for a processing delay time generated in the mask signal generation circuit, thereby reducing the inaccuracy of the mask signal due to the processing delay time. As another example, according to the embodiments, it is possible to adaptively compensate for a processing delay time generated in the mask signal generation circuit, thereby automatically compensating for the deviation of each mask signal generation circuit which may occur in a manufacturing process or an operation environment.

BRIEF DESCRIPTION OF THE DRAWINGS

The above and other aspects, features and advantages of the present disclosure will be more apparent from the following detailed description taken in conjunction with the accompanying drawings, in which.

DETAILED DESCRIPTION

Figure 1:
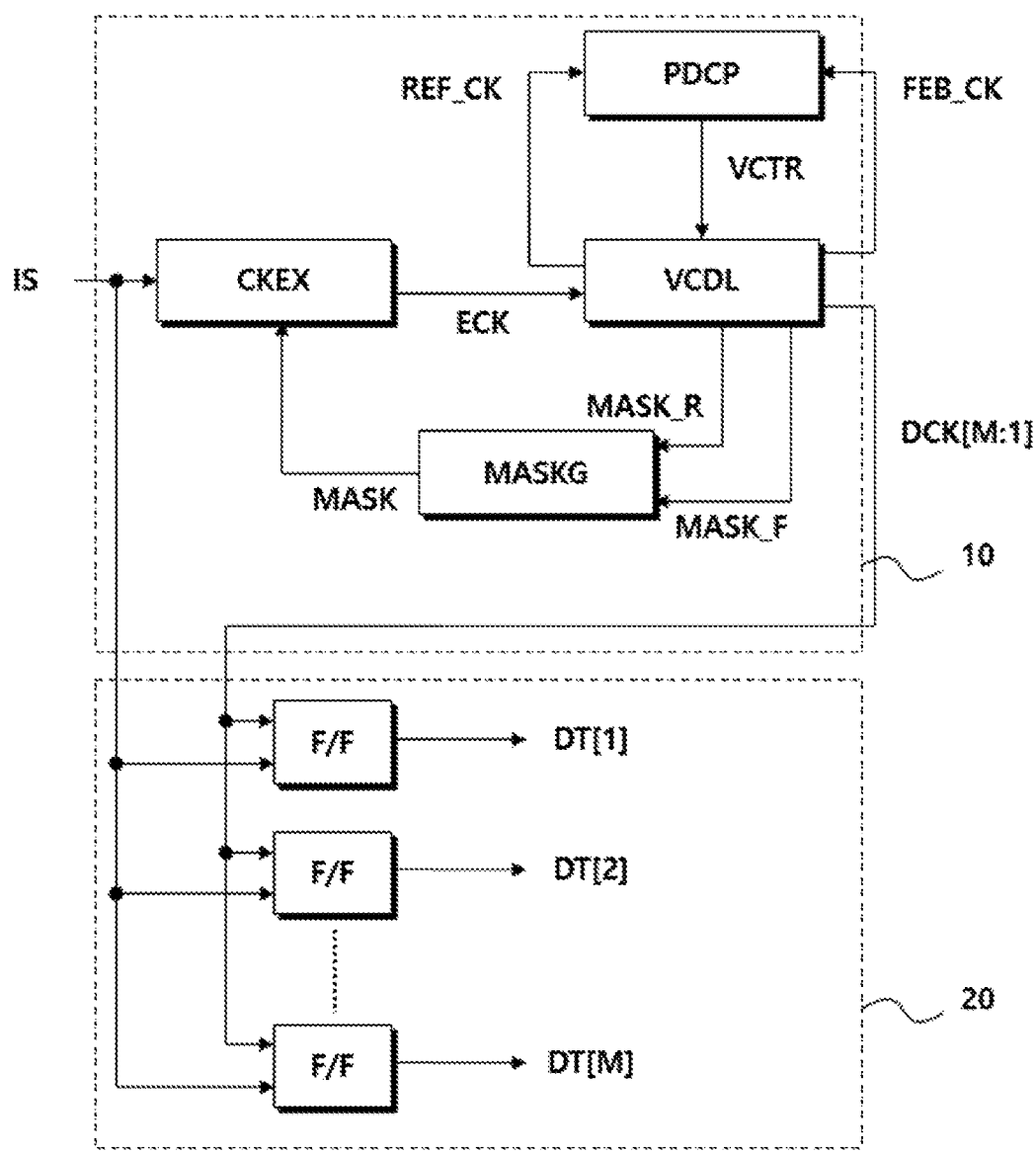
FIG. 1 is a configuration diagram illustrating a general data reception device.

Hereinafter, embodiments of the present disclosure will be described in detail with reference to the accompanying drawings. In adding reference numerals to elements in each drawing, the same elements will be designated by the same reference numerals as far as possible, although they are shown in different drawings. Further, in the following description of the present disclosure, a detailed description of known functions and configurations incorporated herein will be omitted when it is determined that the description may make the subject matter of the present disclosure rather unclear.

In addition, terms, such as first, second, A, B, (a), (b) or the like may be used herein when describing components of the present disclosure. These terms are merely used to distinguish one structural element from other structural elements, and a property, an order, a sequence or the like of a corresponding structural element are not limited by the term. When it is described in the specification that one component is "connected," "coupled" or "joined" to another component, it should be read that the first component may be directly connected, coupled or joined to the second component, but also a third component may be "connected," "coupled," and "joined" between the first and second components.

FIG. 1 is a configuration diagram illustrating a general data reception device.

Referring to FIG. 1, the data reception device may include a clock recovery unit 10 and a data extraction unit 20.

The clock recovery unit 10 may include a clock extraction unit CKEX, a voltage control delay line unit VCDL, a phase feedback unit PDCP, a mask signal generation unit MASKG, and the like.

The clock extraction unit CKEX may generate an extraction clock ECK through a signal in a time interval indicated by a mask signal MASK in an interface signal IS.

The voltage control delay line unit VCDL may generate a plurality of data clock signals DCK by time-delaying the extraction clock ECK. The voltage control delay line unit VCDL may control the time-delaying on the extraction clock ECK so that the phase of one data clock signal of the plurality of data clock signals DCK is synchronized with the phase of another data clock signal.

For example, the voltage control delay line unit VCDL may transmit, to the phase feedback unit PDCP, one data clock signal obtained by time-delaying the extraction clock ECK by one unit time as a feedback clock signal FEB_CK, and may transmit, to the phase feedback unit PDCP, another data clock signal obtained by time-delaying the extraction clock ECK by (N+1) unit times as a reference clock signal REF_CK.

The phase feedback unit PDCP may transmit, to the voltage control delay line unit VCDL, a voltage control signal VCTR corresponding to a phase difference between the above-mentioned one data clock signal and the other data clock signal. The voltage control delay line unit VCDL may adjust a time-delay time of the extraction clock ECK according to the voltage control signal VCTR so that the phase of the above-mentioned one data clock signal can be synchronized with the phase of the other data clock signal. According to this synchronization, the phase difference between the respective data clock signals can be equal to a unit time in which information is divided.

The voltage control delay line unit VCDL may generate a mask rising signal MASK_R and a mask falling signal MASK_F together with the plurality of data clock signals DCK, and may transmit the generated signals to the mask signal generating unit MASKG. Here, the mask rising signal MASK_R may be a signal that is delayed in time by R unit times (R is a value corresponding to an integer multiple of 0.5) from the extraction clock ECK, and the mask falling signal MASK_F may be a signal that is delayed in time by Q (Q is a value corresponding to an integer multiple of 0.5 and larger than R) unit times from the extraction clock ECK.

The mask signal generation unit MASKG may generate a rising edge of the mask signal MASK in accordance with the mask rising signal MASK_R, and may generate a falling edge of the mask signal MASK in accordance with the mask falling signal MASK_F, thereby generating the mask signal MASK.

Meanwhile, when the data clock signal DCK is generated in the clock recovery unit 10, the data extraction unit 20 may use a latch circuit F/F to latch the interface signal IS in accordance with each data clock signal DCK, thereby generating a data signal DT.

Figure 2:
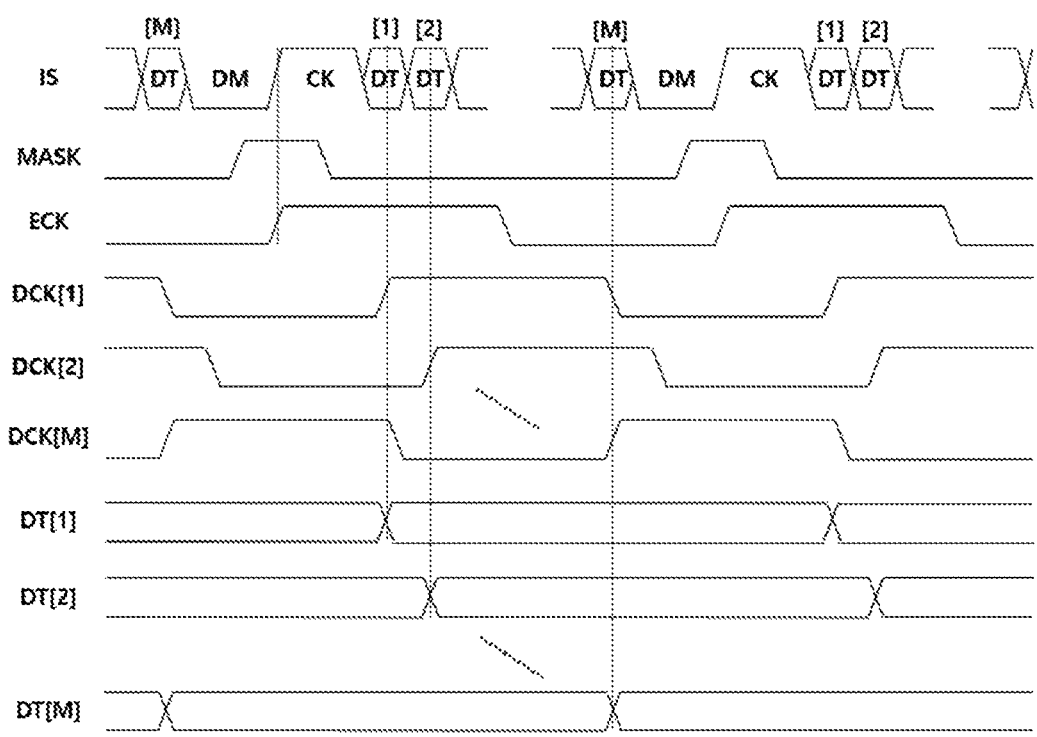
FIG. 2 is a timing diagram illustrating a main signal in the data reception device shown in FIG. 1.

FIG. 2 is a timing diagram illustrating a main signal in the data reception device shown in FIG. 1.

Referring to FIG. 2, a data signal DT, a dummy signal DM, and a clock signal CK may be inserted into an interface signal IS. The respective bits of the data signal DT may be divided into unit times, and one bit of the data signal DT can be inserted in one unit time. The clock signal CK is a portion into which a clock is inserted and may have a size of one unit time or two unit times. The dummy signal DM is a portion other than the data signal DT or the clock signal CK and may be inserted to maintain an interval between the data signal DT and the clock signal CK, or may be inserted as a preliminary section for expansion of the data signal DT.

The mask signal MASK is a signal indicating a time interval in which the clock signal CK is inserted in the interface signal IS, and a clock recovery device may extract a clock signal CK embedded in the interface signal IS from a time interval between the rising edge and falling edge of the mask signal MASK Meanwhile, the clock signal is a signal repeated with a predetermined period. As shown in FIG. 2, the entire portion CK repeated with a predetermined time interval may be regarded as a clock signal. However, from another viewpoint, the rising edge of this portion CK may be regarded as a clock signal.

The clock extraction unit may detect a level change of the interface signal IS in a time interval in which the mask signal MASK is maintained at a high level, and may generate the extraction clock ECK at a time point when the rising edge or the falling edge appears in the interface signal IS.

The voltage control delay line unit may generate a plurality of data clocks (DCK where M is a natural number of 2 or more) by time-delaying the extraction clock ECK.

The data extraction unit may generate a data signal (DT[M:1]) by latching the interface signal IS at the rising edge of each data clock DCK.

Meanwhile, the master signal generation unit may generate the mask signal MASK at a time delayed by a unit time of a predetermined multiple from the extraction clock ECK. When one period of the interface signal IS is divided into N unit times (N is a natural number equal to or greater than 2), the master signal generation unit may generate the mask signal MASK so that the rising edge can be formed at a time point delayed by (N−0.5) unit times from the extraction clock ECK and the falling edge can be formed at a time point delayed by (N+0.5) unit times. This enables the clock extraction unit to detect the clock signal CK of the interface signal IS at the intermediate time point of the time interval during which the mask signal MASK is maintained at the high level.

The rising edge and falling edge of the mask signal MASK are generated by the voltage control delay line unit that time-delays the extraction clock ECK. The voltage control delay line unit may generate a mask rising signal at a time point delayed by (N−0.5) unit times from the extraction clock ECK and may generate a mask falling signal at a time point delayed by (N+0.5) unit times.

The mask signal generation unit may use the mask rising signal and the mask falling signal transmitted from the voltage control delay line unit to generate the mask signal MASK.

Meanwhile, the mask signal generation unit may form the rising edge of the mask signal MASK according to the mask rising signal through an internal circuit, and may form the falling edge of the mask signal MASK according to the mask falling signal. However, since a processing delay time occurs in the internal circuit, the rising edge of the mask signal MASK and the mask rising signal are not synchronized with each other and have a predetermined time difference therebetween, and the falling edge of the mask signal MASK and the mask falling signal are not synchronized with each other and have a predetermined time difference therebetween.

Figure 3:
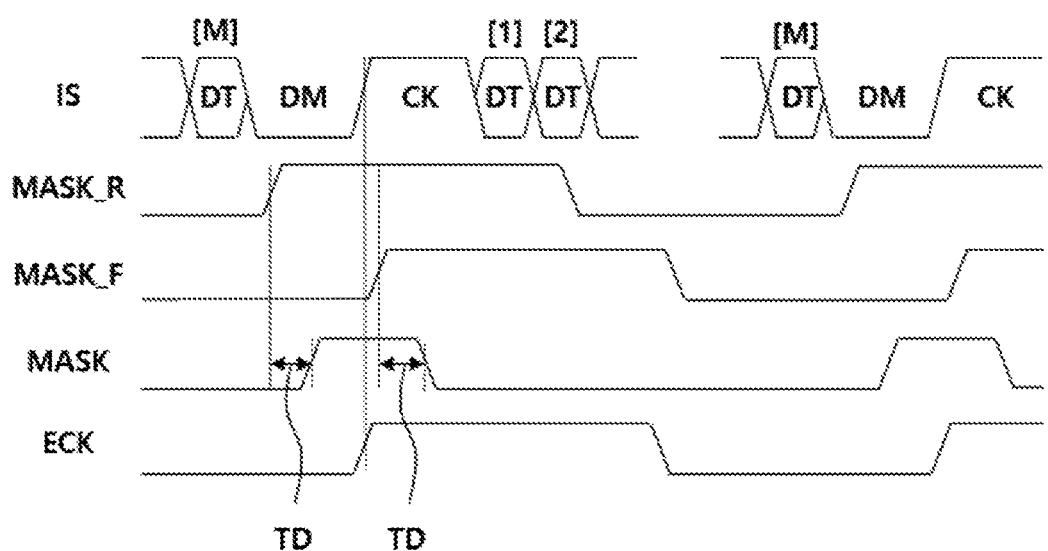
FIG. 3 is a diagram illustrating a time difference between each of a mask rising signal and a mask falling signal with a mask signal.

FIG. 3 is a diagram illustrating a time difference between each of a mask rising signal and a mask falling signal with a mask signal.

Referring to FIG. 3, a predetermined time difference TD between the rising edge of the mask signal MASK and the mask rising signal MASK_R may occur, and a predetermined time difference TD between the falling edge of the mask signal MASK and the mask falling signal MASK_F may occur. Although such a time difference TD may occur due to the processing delay time of the mask signal generation unit, the time difference TD may be affected by other factors.

Meanwhile, the mask signal generation unit may generate the mask rising signal MASK_R and the mask falling signal MASK_F in consideration of the above-described time difference TD in order to detect the clock signal CK in the vicinity of the center of the high level interval of the mask signal MASK.

For example, the mask signal generation unit may generate the mask rising signal MASK_R at a time point (less delayed time point) earlier by the above-described time difference TD than a time point delayed by (N−0.5) unit times from the extraction clock ECK, and may generate the mask falling signal MASK_F at a time point (less delayed time point) earlier by the above-described time difference TD than a time point delayed by (N+0.5) unit times.

However, since the above-described time difference TD may have a difference for each product in accordance with the manufacturing process and operation environment of the mask signal generation unit, if the time difference is fixed to a predetermined value and applied as in the above-described method, the mask signal generation unit may not accurately recover the clock signal. For example, if the above-described time difference TD is erroneously applied, the falling edge of the mask signal MASK is earlier than the rising edge of the clock signal CK so that the rising edge of the clock signal CK may not be included in the high level time interval of the mask signal MASK. As another example, if the above-described time difference TD is erroneously applied, the rising edge of the mask signal MASK is later than the rising edge of the clock signal CK so that the rising edge of the clock signal CK may not be included in the high level time interval of the mask signal MASK.

In order to solve these problems, the embodiment of the disclosure provides a technique for adaptively applying the above-described time difference TD. Some of the configurations of this embodiment may be the same as those described with reference to FIGS. 1 to 3, and configurations of which functions and details are omitted can be understood with reference to the above description.

Figure 4:
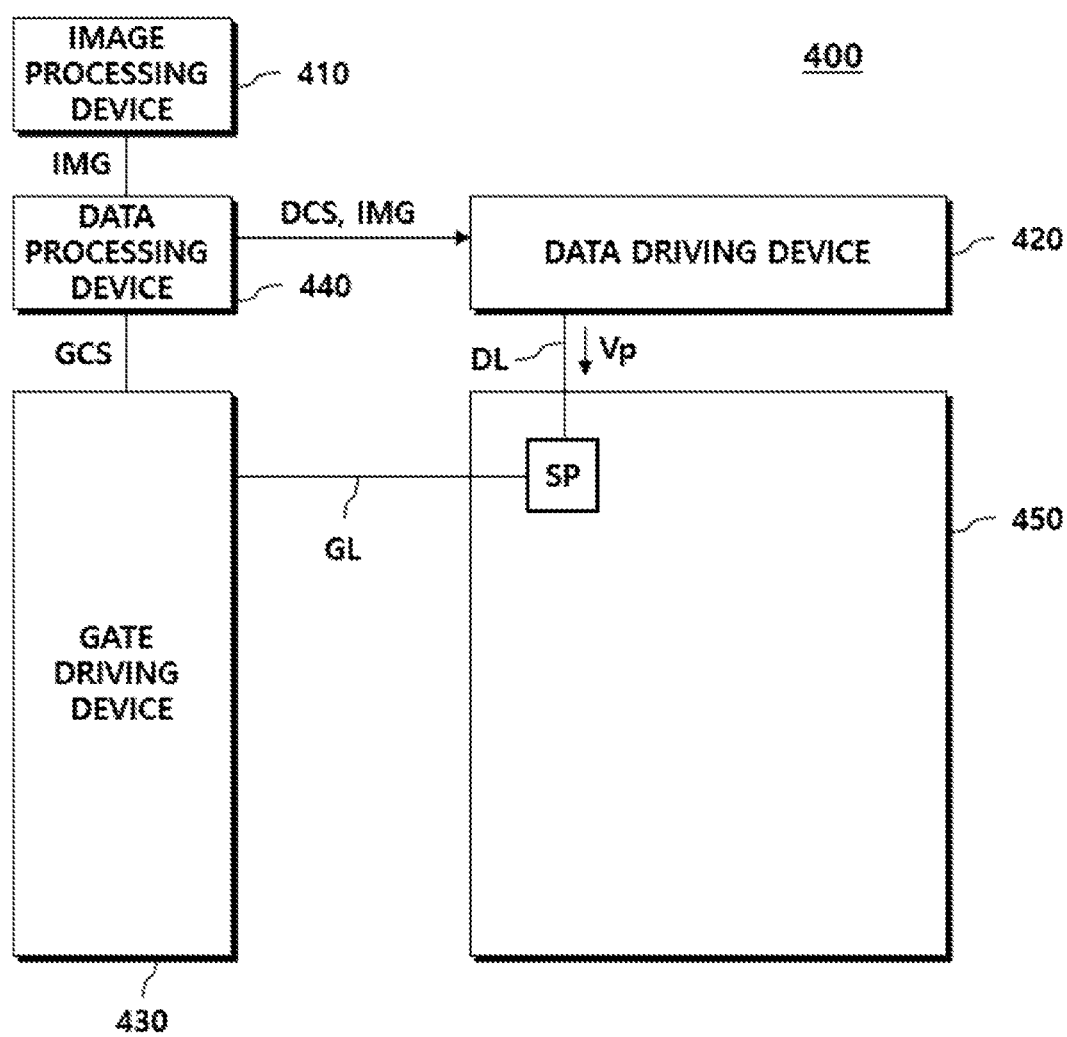
FIG. 4 is a configuration diagram illustrating a display apparatus according to an embodiment.

FIG. 4 is a configuration diagram illustrating a display apparatus according to an embodiment.

Referring to FIG. 4, a display apparatus 400 may include a plurality of panel driving devices 410, 420, 430, and 440, and a display panel 450.

On the display panel 450, a plurality of data lines DL and a plurality of gate lines GL are disposed and a plurality of pixels may be disposed. A pixel may be composed of a plurality of subpixels SP. The subpixels may include R (red), G (green), B (blue), W (white), and the like. One pixel may be composed of subpixels SP of RGB, subpixels SP of RGBG, subpixels SP of RGBW, or the like. Hereinafter, for convenience of description, one pixel is described as being composed of subpixels of RGB.

The panel driving devices 410, 420, 430, and 440 are devices that generate signals for displaying an image on the display panel 450 and may correspond to an image processing device 410, a data driving device 420, a gate driving device 430, and a data processing device 440.

The gate driving device 430 may supply a gate driving signal of a turn-on voltage or a turn-off voltage to the gate line GL. When the gate driving signal of the turn-on voltage is supplied to the subpixel SP, the subpixel SP is connected to the data line DL. When the gate driving signal of the turn-off voltage is supplied to the subpixel SP, the connection between the subpixel SP and the data line DL is released. The gate driving device 430 may be referred to as a gate driver.

The data driving device 420 may supply a data voltage Vp to the subpixel SP through the data line DL. The data voltage Vp supplied to the data line DL may be supplied to the subpixel SP according to the gate driving signal. The data driving device 420 may be referred to as a source driver.

The data processing device 440 may supply a control signal to the gate driving device 430 and the data driving device 420. For example, the data processing device 440 may transmit a gate control signal GCS to the gate driving device 430 to cause scan to start. The data processing device 440 may output image data IMG to the data driving device 420. The data processing device 440 may transmit a data control signal DCS that controls the data driving device 420 to supply the data voltage Vp to each subpixel SP. The data processing device 440 may be referred to as a timing controller.

The image processing device 410 may generate image data IMG and may transmit the image data IMG to the data processing device 440. The image processing device 410 may be referred to as a host.

Meanwhile, a communication interface is formed between the data processing device 440 and the data driving apparatus 420, and the data processing device 440 may transmit the data control signal DCS and/or the image data IMG to the data driving device 420.

Figure 5:
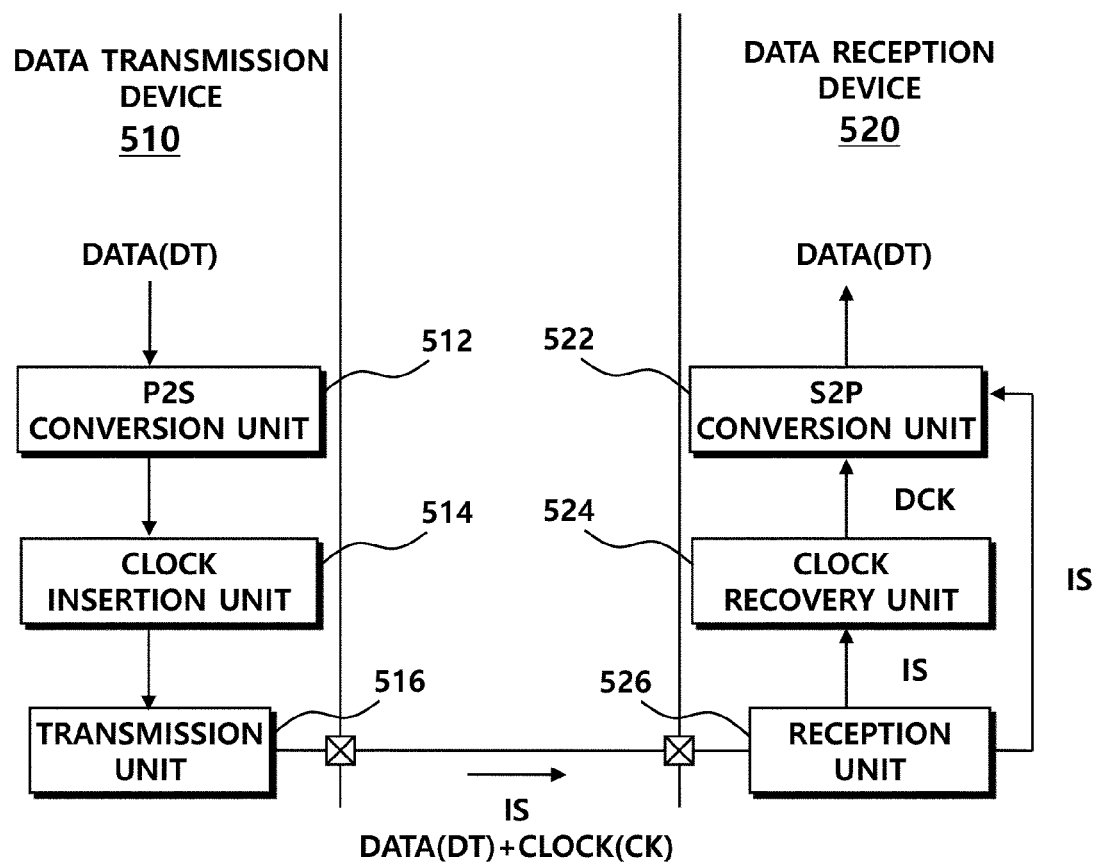
FIG. 5 is a configuration diagram illustrating a data transmission device and a data reception device according to an embodiment.

FIG. 5 is a configuration diagram illustrating a data transmission device and a data reception device according to an embodiment.

A data transmission device 510 shown in FIG. 5 may be included in the one panel driving device described with reference to FIG. 4, and a data reception device 520 may be included in another panel driving device described with reference to FIG. 4.

As an example, the data transmission device 510 may be included in a data processing device (see 440 in FIG. 4) and the data reception device 520 may be included in a data driving device (see 420 in FIG. 4). At this time, the data transmission device 510 can transmit image data or a data control signal as data DT to be transmitted.

As another example, the data transmission device 510 may be included in the data driving device (see 420 in FIG. 4), and the data reception device 520 may be included in the data processing device (see 440 in FIG. 4). At this time, the data transmission device 510 can transmit sensing data for pixels as the data DT to be transmitted.

The data transmission device 510 may include a parallel/serial (P2S) conversion unit 512, a clock insertion unit 514, a transmission unit 516, and the like.

The P2S conversion unit 512 may convert data DT processed by parallel communication into data processed by serial communication. The clock insertion unit 514 may generate an interface signal IS by combining the data DT converted to serial and a clock CK. The transmission unit 516 may transmit the interface signal IS to the data reception device 520 through a signal line.

The data reception device 520 may include an S2P conversion unit 522, a clock recovery unit 524, a reception unit 526, and the like.

The reception unit 526 may receive the interface signal IS through the signal line. The clock recovery unit 524 may recover the clock CK from the interface signal IS, may generate a data clock signal DCK, and may transmit the data clock signal DCK to the S2P conversion unit 522. The S2P conversion unit 522 (a serial/parallel conversion unit 522) may convert a portion where a data signal is inserted in the interface signal IS into parallel data through the data clock signal DCK, thereby recovering the data DT.

When the data transmission device 510 is included in the data processing device described with reference to FIG. 4 and the data reception device 520 is included in the data driving device described with reference to FIG. 4, the data DT may include the image data or the data control signal.

When the data transmission 510 is included in the data driving device described with reference to FIG. 4 and the data reception device 520 is included in the data processing device described with reference to FIG. 4, the data DT may be the sensing data for pixels.

Figure 6:
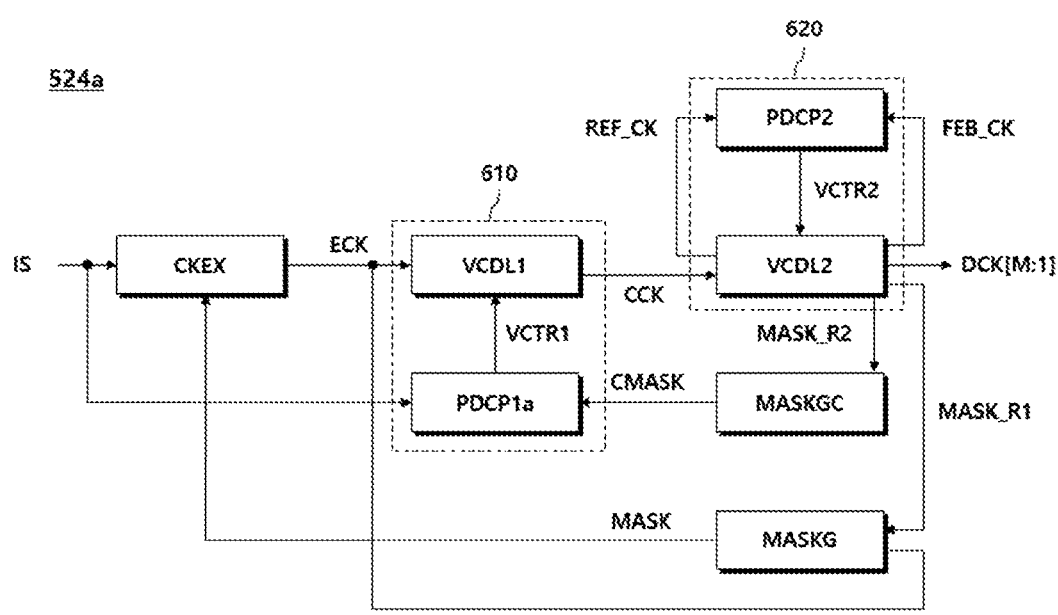
FIG. 6 is a first exemplary configuration diagram illustrating a clock recovery unit according to an embodiment.

FIG. 6 is a first exemplary configuration diagram illustrating a clock recovery unit according to an embodiment.

Referring to FIG. 6, a clock recovery unit 524a may include a clock extraction unit CKEX, a mask signal generation unit MASKG, a mask duplication signal generation unit MASKGC, a first time-delay control unit 610, and a second time-delay control unit 620.

The mask signal generation unit MASKG may generate a mask signal MASK in accordance with a first mask reference signal MASK_R1. The first mask reference signal MASK_R1 may be a mask rising signal. The mask signal generation unit MASKG may form the rising edge of the mask signal MASK in accordance with the first mask reference signal MASK_R1.

The mask signal generation unit MASKG may include a first internal circuit including at least one logic circuit, and may form the rising edge of the mask signal MASK in accordance with the first mask reference signal MASK_R1 through the first internal circuit. At this time, a processing delay time of the first internal circuit may occur. In accordance with the processing delay time, a predetermined time difference may occur between the first mask reference signal MASK_R1 and the rising edge of the mask signal MASK.

The mask duplication signal generation unit MASKGC may generate mask duplication signal CMASK in accordance with a second mask reference signal MASK_R2. The second mask reference signal MASK_R2 may be a mask rising signal. The mask duplication signal generation unit MASKGC may form the rising edge of the mask duplication signal CMASK in accordance with the second mask reference signal MASK_R2.

The mask duplication signal generation unit MASKGC may include a second internal circuit including at least one logic circuit, and may form the rising edge of the mask duplication signal CMASK in accordance with the second mask reference signal MASK_R2 through the second internal circuit. At this time, a processing delay time of the second internal circuit may occur. In accordance with the processing delay time, a predetermined time difference may occur between the second mask reference signal MASK_R2 and the rising edge of the mask duplication signal CMASK.

The first internal circuit and the second internal circuit may be similarly configured. For example, a portion forming the rising edge of the mask signal MASK in accordance with the first mask reference signal MASK_R1 in the first internal circuit and a portion forming the rising edge of the mask duplication signal CMASK in accordance with the second mask reference signal MASK_R2 in the second internal circuit may be substantially the same.

In this case, the processing delay time of the first internal circuit and the processing delay time of the second internal circuit may be substantially the same, or a difference therebetween may be within a predetermined time. More specifically, a time difference between the first mask reference signal MASK_R1 and the rising edge of the mask signal MASK and a time difference between the second mask reference signal MASK_R2 and the rising edge of the mask duplication signal CMASK may be substantially the same.

Meanwhile, the mask signal MASK may be transmitted to the clock extraction unit CKEX. The clock extraction unit CKEX may generate an extraction clock ECK through a signal at a time interval indicated by the mask signal MASK in the interface signal IS in which a clock signal is embedded.

The first time-delay control unit 610 may generate a compensation clock CCK by time-delaying the extraction clock ECK. The first time-delay control unit 610 may control the time-delay of the extraction clock ECK in a manner such that a phase difference between a signal of a portion (e.g., a signal level change portion of the dummy signal and the clock signal in the interface signal IS described with reference to FIG. 2) corresponding to the clock signal in the interface signal IS and the mask duplication signal CMASK becomes smaller.

The first time-delay control unit 610 may include a first voltage control delay line unit VCDL1 and a first phase difference feedback unit PDCP1a.

The first voltage control delay line unit VCDL1 may be a delay circuit including at least one delay means connected in series. The first voltage control delay line unit VCDL1 may output the compensation clock CCK by time-delaying the extraction clock ECK through the above-described delay means. The first voltage control delay line unit VCDL1 may adjust the degree of time delay in accordance with the first voltage control signal VCTR1. The first voltage control signal VCTR1 that controls the first voltage control delay line unit VCDL1 may be transmitted from a first phase difference feedback unit PDCP1a.

The first phase difference feedback unit PDCP1a may generate a signal corresponding to a phase difference between the signal of the portion corresponding to the clock signal in the interface signal IS and the mask duplication signal CMASK, as the first voltage control signal VCTR1.

The first phase difference feedback unit PDCP1a may output the first voltage control signal VCTR1 to the first voltage control delay line unit VCDL1.

The first phase difference feedback unit PDCP1a may include a phase detector PD that generates an up signal or a down signal according to a phase difference, a charge pump CP that changes a charge amount in accordance with the up signal or the down signal, and a loop filter LF, and may generate the first voltage control signal VCTR1 using these configurations.

The second time-delay control unit 620 may generate a plurality of data clock signals DCK, the first mask reference signal MASK_R1, and the second mask reference signal MASK_R2 by time-delaying the compensation clock CCK.

The second time-delay control unit 620 may include a second voltage control delay line unit VCDL2 and a second phase difference feedback unit PDCP2.

The second voltage control delay line unit VCDL2 may include a delay circuit composed of a plurality of delay means connected in series. Such a delay means may generate a plurality of data clock signals DCK having different phases by time-delaying the compensation clock CCK. Such a delay circuit may adjust the degree of time delay of each delay means in accordance with the second voltage control signal VCTR2.

The second phase difference feedback unit PDCP2 may generate a signal corresponding to a phase difference between a feedback clock FEB_CK and a reference clock REF_CK as the second voltage control signal VCTR2. The second phase difference feedback unit PDCP2 may output the second voltage control signal VCTR2 to the respective delay means included in the delay circuit.

The feedback clock FEB_CK may be one data clock signal generated by the second voltage control delay line unit VCDL2. The reference clock REF_CK may be another data clock signal through a predetermined number of delay means in this one data clock signal.

For example, one period of the interface signal IS may be divided into N unit times (N is a natural number equal to or greater than 2) in which information is divided. The reference clock REF_CK may be a data clock signal generated by time-delaying the feedback clock FEB_CK by N unit times. At this time, if the phases of the reference clock REF_CK and the feedback clock FEB_CK coincide with each other, the unit time determined by the data reception device matches the unit time intended by the data transmission device.

Meanwhile, according to these configurations, a feedback loop is formed in the clock recovery unit 524a, and the phase of the mask duplication signal CMASK is synchronized with the portion corresponding to the clock signal in the interface signal IS. If the portion corresponding to the clock signal in the interface signal IS and the phase of the mask duplication signal CMASK are synchronized with each other and then the phase of the mask signal MASK is made ahead of the phase of the mask duplication signal CMASK, consequently, the phase of the mask signal MASK is always ahead of the portion corresponding to the clock signal in the interface signal IS. Accordingly, the clock recovery unit 524a may automatically make the phase of the mask signal MASK ahead of the portion corresponding to the clock signal in the interface signal IS without considering other factors.

More specifically, the clock recovery unit 524a may always make the rising edge of the mask signal MASK ahead of the portion corresponding to the clock signal in the interface signal IS through the above-described configuration.

The extent to which the rising edge of the mask signal MASK is ahead of the portion corresponding to the clock signal in the interface signal IS may be determined by a phase difference between the first mask reference signal MASK_R1 and the second mask reference signal MASK_R2. For example, when the phase of the first mask reference signal MASK_R1 is ahead of the phase of the second mask reference signal MASK_R2 by 0.5 unit times, the rising edge of the mask signal MASK is ahead of the portion corresponding to the clock signal in the interface signal IS by 0.5 unit times.

As another example, when the interface signal IS includes a dummy signal interval and a clock signal interval, the phase of the first mask reference signal MASK_R1 may be ahead of the phase of the second mask reference signal MASK_R2 by a time corresponding to the half of the dummy signal interval. In this case, the rising edge of the mask signal MASK may be ahead of the portion corresponding to the clock signal in the interface signal IS by the time corresponding to the half of the dummy signal interval.

The falling edge of the mask signal MASK may be located in the clock signal interval. However, the mask signal generation unit MASKG may receive the extraction clock ECK and may form the falling edge of the mask signal MASK in accordance with the extraction clock ECK or a signal obtained by time-delaying the extraction clock ECK by a predetermined time, whereby the falling edge of the mask signal MASK may be easily located in the clock signal interval.

Figure 7:
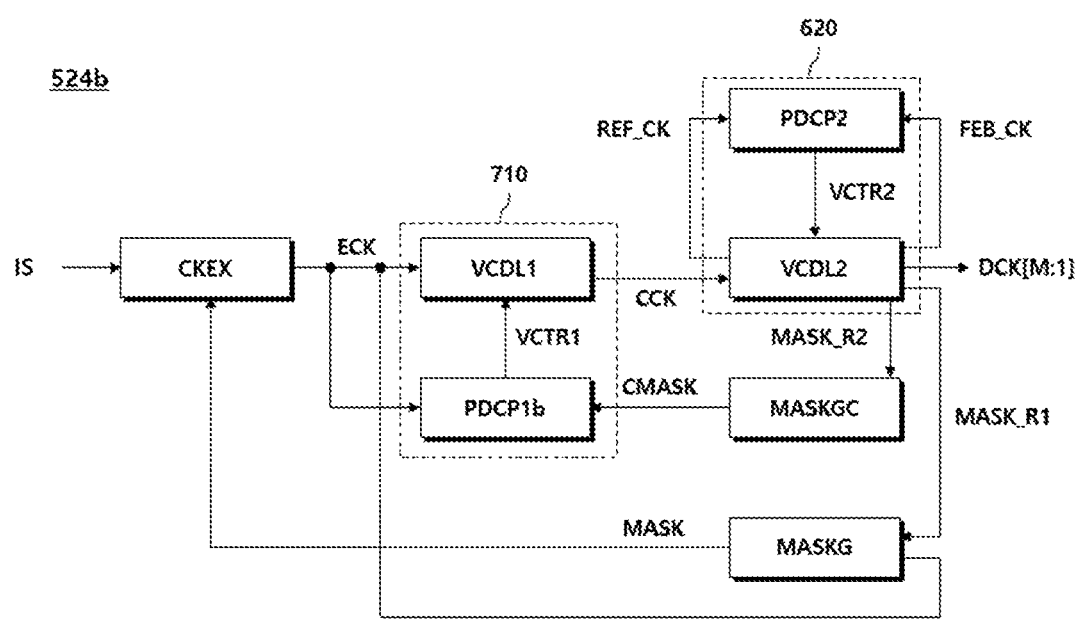
FIG. 7 is a second exemplary configuration diagram illustrating a clock recovery unit according to an embodiment.

FIG. 7 is a second exemplary configuration diagram illustrating a clock recovery unit according to an embodiment.

Based on a comparison between FIGS. 6 and 7, there is a difference in that the first time-delay control unit 610 receives the interface signal IS in the clock recovery unit 524a according to a first example and the second time-delay control unit 710 receives the extraction clock ECK in the clock recovery unit 524b according to a second example, and the remaining functions may be the same. In the description of the second example, some of the content overlapping the first example may be omitted.

Referring to FIG. 7, the clock recovery unit 524b may include a clock extraction unit CKEX, a mask signal generation unit MASKG, a mask duplication signal generation unit MASKGC, a first time-delay control unit 710, and a second time-delay control unit 620.

The first time-delay control unit 710 may generate a compensation clock CCK by time-delaying the extraction clock ECK. The first time-delay control unit 710 may control the time delay of the extraction clock ECK so that a phase difference between the extraction clock ECK and the mask duplication signal CMASK becomes smaller.

The first time-delay control unit 710 may include a first voltage control delay line unit VCDL1 and a first phase difference feedback unit PDCP1b.

The first voltage control delay line unit VCDL1 may be a delay circuit including at least one delay means connected in series. The first voltage control delay line unit VCDL1 may output the compensation clock CCK by time-delaying the extraction clock ECK through the above-described delay means. The first voltage control signal VCTR1 that controls the first voltage control delay line unit VCDL1 may be transmitted from the first phase difference feedback unit PDCP1b.

The first phase difference feedback unit PDCP1b may generate a signal corresponding to a phase difference between the extraction clock ECK and the mask duplication signal CMASK as the first voltage control signal VCTR1. The first phase difference feedback unit PDCP1b may output the first voltage control signal VCTR1 to the first voltage control delay line unit VCDL1.

The first phase difference feedback unit PDCP1b may include a phase detector PD that generates an up signal or a down signal in accordance with a phase difference, a charge pump CP that changes a charge amount in accordance with the up signal or the down signal, and a loop filter LF, and may generate the first voltage control signal VCTR1 using these configurations.

According to these configurations, a feedback loop is formed in the clock recovery unit 524b, and the phases of the extraction clock ECK and the mask duplication signal CMASK are synchronized with each other. If the phases of the extraction clock ECK and the mask duplication signal CMASK are synchronized with each other in this manner and then the phase of the mask signal MASK is made ahead of the phase of the mask duplication signal CMASK, consequently, the phase of the mask signal MASK is always ahead of the extraction clock ECK. Accordingly, the clock recovery unit 524b may automatically make the phase of the mask signal MASK ahead of the extraction clock ECK without considering other factors.

More specifically, the clock recovery unit 524b may always make the rising edge of the mask signal MASK ahead of the extraction clock ECK through the above-described configuration.

The extent to which the rising edge of the mask signal MASK is ahead of the extraction clock ECK may be determined by a phase difference between the first mask reference signal MASK_R1 and the second mask reference signal MASK_R2. For example, when the phase of the first mask reference signal MASK_R1 is ahead of the phase of the second mask reference signal MASK_R2 by 0.5 unit times, the rising edge of the mask signal MASK is ahead of the extraction clock ECK by 0.5 unit times.

As another example, when the interface signal IS includes a dummy signal interval and a clock signal interval, the phase of the first mask reference signal MASK_R1 may be ahead of the phase of the second mask reference signal MASK_R2 by a time corresponding to the half of the dummy signal interval. In this case, the rising edge of the mask signal MASK may be ahead of the extraction clock ECK by the time corresponding to the half of the dummy signal interval.

The falling edge of the mask signal MASK may be located in the clock signal interval. However, the mask signal generation unit MASKG may receive the extraction clock ECK and may form the falling edge of the mask signal MASK in accordance with the extraction clock ECK or a signal obtained by time-delaying the extraction clock ECK by a predetermined time, whereby the falling edge of the mask signal MASK may be easily located in the clock signal interval.

Figure 8:
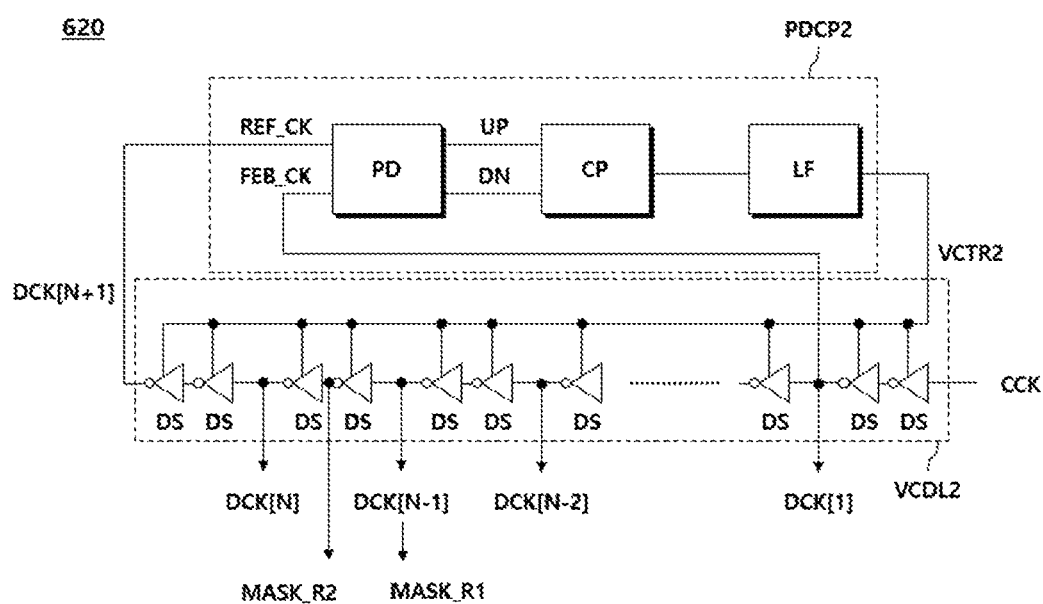
FIG. 8 is a configuration diagram illustrating a second time-delay control unit according to an embodiment.

FIG. 8 is a configuration diagram illustrating a second time-delay control unit according to an embodiment.

Referring to FIG. 8, the second time-delay control unit 620 may include the second voltage control delay line unit VCDL2 and the second phase difference feedback unit PDCP2.

The second voltage control delay line unit VCDL2 may include a plurality of delay means DS. Each delay means DS may be an inverter accompanied by a time delay, and two delay means DS may take charge of a time delay by one unit time.

The second voltage control delay line unit VCDL2 may generate a plurality of data clock signals (DCK [N:1]) using the plurality of delay means DS.

The second voltage control delay line unit VCDL2 may output one data clock signal among the plurality of data clock signals (DCK [N:1]) as a feedback clock FEB_CK, and may output another data clock signal as a reference clock REF_CK. When one period of the interface signal is divided into N unit times, the reference clock REF_CK may be a clock obtained by time-delaying the feedback clock FEB_CK by the N unit times.

The second phase difference feedback unit PDCP2 may include a phase detector PD, a charge pump CP, and a loop filter LF.

The phase detector PD may selectively output an up signal UP and a down signal DN to correspond to a phase difference between the feedback clock FEB_CK and the reference clock REF_CK. The charge pump CP may generate an output voltage to correspond to the up signal UP and the down signal DN, and the loop filter LF may generate the second voltage control signal VCTR2 according to the output voltage of the charge pump CP.

The second voltage control signal VCTR2 may be a driving voltage of the delay means DS. At this time, when the voltage of the second voltage control signal VCTR2 is high, the current of the delay means DS may increase to decrease the time delay of the delay means DS. Conversely, when the voltage of the second voltage control signal VCTR2 is low, the current of the delay means DS may decrease to increase the time delay of the delay means DS.

The second voltage control delay line unit VCDL2 may output the first mask reference signal MASK_R1 and the second mask reference signal MASK_R2 together with the data clock signal DCK.

The second mask reference signal MASK_R2 may be a signal delayed in time with respect to the first mask reference signal MASK_R1, and the delayed time may be 0.5 unit times. Each delay means DS may delay the time by 0.5 unit times, and the first mask reference signal MASK_R1 and the second mask reference signal MASK_R2 may be signals output before and after one delay means DS.

Figure 9:
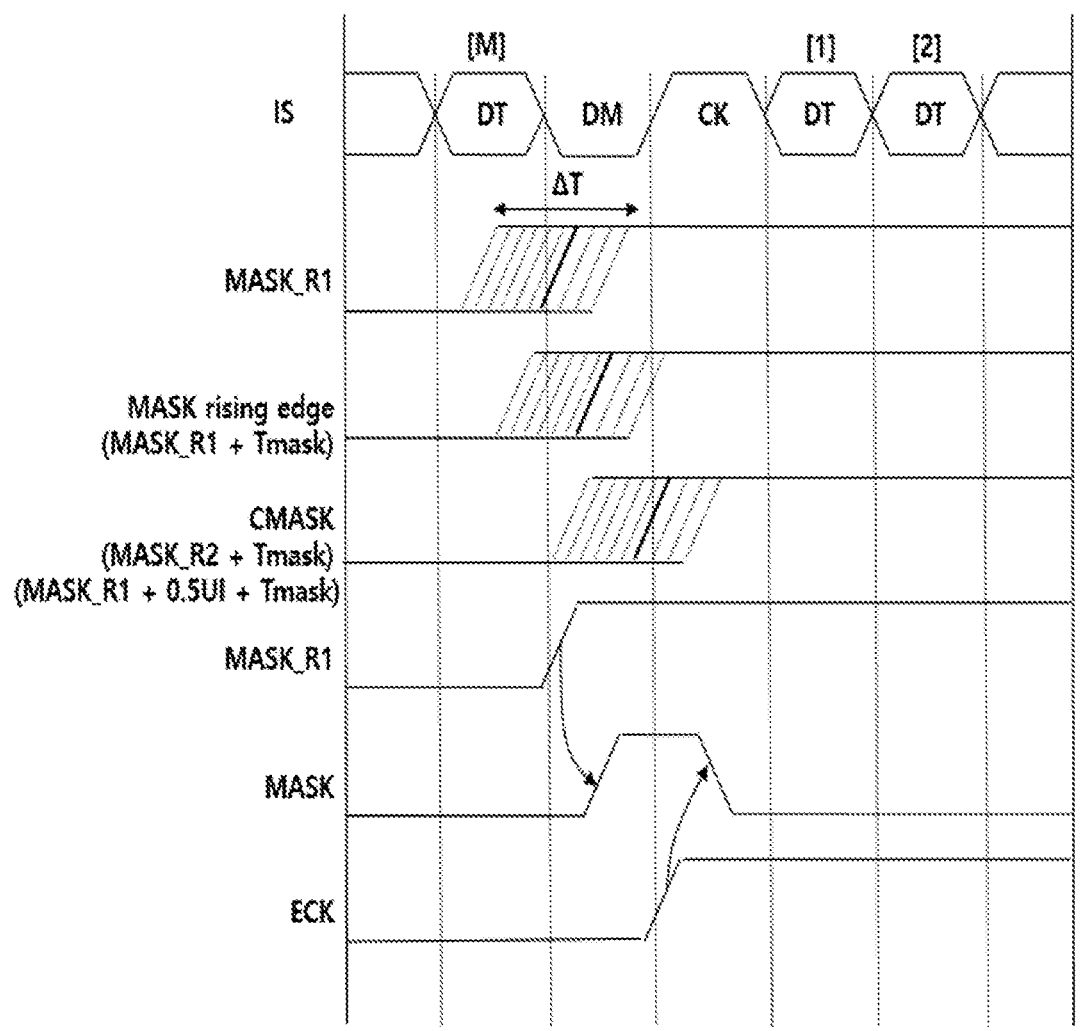
FIG. 9 is a timing diagram illustrating a main signal in a clock recovery unit according to an embodiment.

FIG. 9 is a timing diagram illustrating a main signal in a clock recovery unit according to an embodiment.

Referring to FIG. 9, the mask duplication signal CMASK may be synchronized in phase with the extraction clock ECK. A phase difference between the mask duplication signal CMASK and the extraction clock ECK is fed back in the first time-delay control unit. According to this control, the mask duplication signal CMASK can be synchronized in phase with the extraction clock ECK.

The mask duplication signal CMASK may be a signal in which the second mask reference signal MASK_R2 is delayed by a processing delay time Tmask of the mask duplication signal generation unit. When the second mask reference signal MASK_R2 is delayed by 0.5 unit times UI from the first mask reference signal MASK_R1, the mask duplication signal CMASK can be regarded that the first mask reference signal MASK_R1 is delayed by a value obtained by adding 0.5 unit times UI to the processing delay time Tmask of the mask duplication signal generation unit. When the processing delay time Tmask of the mask duplication signal generation unit is substantially equal to the processing delay time Tmask of the mask signal generation unit, the mask duplication signal CMASK can be regarded that the first mask reference signal MASK_R1 is delayed by a value obtained by adding 0.5 unit times UI to the processing delay time Tmask of the mask signal generation unit.

Since the mask duplication signal CMASK and the extraction clock ECK are synchronized with each other, the extraction clock ECK can be regarded that the first mask reference signal MASK_R1 is delayed by a value obtained by adding 0.5 unit times UI to the processing delay time Tmask of the mask signal generation unit. Since the fact that the first mask reference signal MASK_R1 is delayed by the processing delay time Tmask of the mask signal generation unit may correspond to the rising edge of the mask signal MASK, consequently, the extraction clock ECK may be regarded as being delayed by the value obtained by adding 0.5 unit times UI to the rising edge of the mask signal MASK The rising edge of the mask signal MASK may be formed by the first mask reference signal MASK_R1 and the falling edge thereof may be formed by the extraction clock ECK According to this, the rising edge of the mask signal MASK may be controlled to be ahead of the extraction clock ECK by 0.5 unit times UI, and the falling edge thereof may be controlled to be delayed by 0.5 unit times UI from the extraction clock ECK.

The first mask reference signal may have a constant variation range ΔT, and this variation range ΔT may correspond to a controllable range of the first time-delay control unit. If the controllable range of the first time-delay control unit has a wider range than the variation range of the processing delay time Tmask of the mask signal generation unit, all deviations of a product can be automatically corrected.

Figure 10:
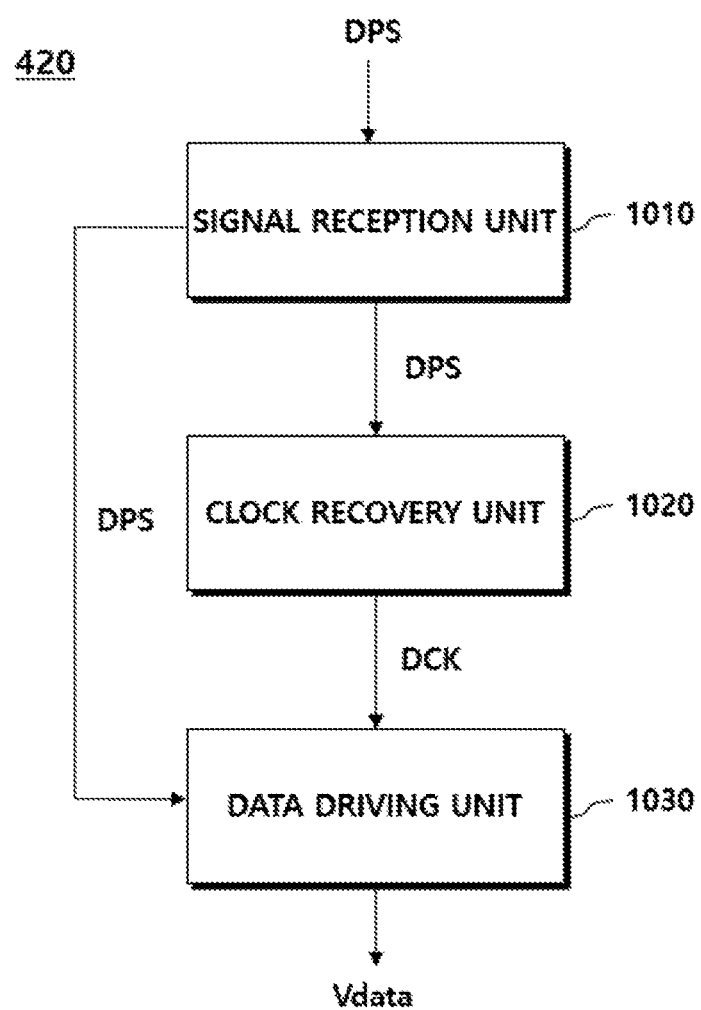
FIG. 10 is a configuration diagram illustrating a data driving device.

FIG. 10 is a configuration diagram illustrating a data driving device.

Referring to FIG. 10, the data driving device 420 may include a signal reception unit 1010, a clock recovery unit 1020, a data driving unit 1030, and the like.

The signal reception unit 1010 may receive a display signal DPS with the clock signal embedded therein from the data processing device. The display signal DPS is a sort of the interface signal and includes a data control signal, image data, and the like as data, and the clock signal may be embedded in the display signal DPS.

The clock recovery unit 1020 may recover the clock signal from the display signal DPS to generate a plurality of data clock signals DCK.

The data driving unit 1030 may extract image data from the display signal DPS in accordance with the plurality of data clock signals DCK, and may generate a data voltage Vdata in accordance with the image data to drive pixels disposed on a panel.

The clock recovery unit 1020 may generate an extraction clock through a time interval indicated by a mask signal in the display signal DPS, may generate a compensation clock by time-delaying the extraction clock, and may generate a plurality of data clock signals DCK and a mask signal using the compensation clock. The clock recovery unit 1020 may control the time delay for the extraction clock so that the mask duplication signal delayed in time by a predetermined time with the mask signal can be synchronized in phase with the extraction clock.

One period of the display signal is divided into a plurality of unit time in which information is divided, and the mask duplication signal may have a time delay within a unit time with the mask signal.

The clock recovery unit 1020 may include a mask signal generation unit that generates a mask signal in accordance with a first mask rising signal and a mask duplication signal generation unit that generates a mask duplication signal in accordance with a second mask rising signal delayed in time by a predetermined time from the first mask rising signal.

The mask duplication signal generation unit may include the same logic circuit as that of the mask signal generation unit.

The display signal may be a serial signal, and the data driving unit may include a serial/parallel conversion unit that converts a portion of image data in the display signal into parallel data.

As described above, according to the embodiments, the clock signal can be accurately recovered from the interface signal. As an example, according to embodiments, it is possible to accurately recover the clock signal from the interface signal by allowing a mask signal to accurately indicate a portion into which the clock signal is inserted in the interface signal with the clock signal embedded therein. As another example, according to the embodiments, it is possible to generate a mask signal by compensating for a processing delay time generated in the mask signal generation circuit, thereby reducing the inaccuracy of the mask signal due to the processing delay time. As another example, according to the embodiments, it is possible to adaptively compensate for a processing delay time generated in the mask signal generation circuit, thereby automatically compensating for the deviation of each mask signal generation circuit which may occur in a manufacturing process or an operation environment.

Since terms, such as "including," "comprising," and "having" mean that corresponding elements may exist unless they are specifically described to the contrary, it shall be construed that other elements can be additionally included, rather than that such elements are omitted. All technical, scientific or other terms are used consistently with the meanings as understood by a person skilled in the art unless defined to the contrary. Common terms as found in dictionaries should be interpreted in the context of the related technical writings, rather than overly ideally or impractically, unless the present disclosure expressly defines them so.

Although a preferred embodiment of the present disclosure has been described for illustrative purposes, those skilled in the aft will appreciate that various modifications, additions and substitutions are possible, without departing from the scope and spirit of the embodiment as disclosed in the accompanying claims. Therefore, the embodiments disclosed in the present disclosure are intended to illustrate the scope of the technical idea of the present disclosure, and the scope of the present disclosure is not limited by the embodiment. The scope of the present disclosure shall be construed on the basis of the accompanying claims in such a manner that all of the technical ideas included within the scope equivalent to the claims belong to the present disclosure.

What is claimed is:

1. A clock recovery device comprising:
   a mask signal generation circuit configured to generate a mask signal in accordance with a first mask reference signal;
   a mask duplication signal generation circuit configured to generate a mask duplication signal in accordance with a second mask reference signal;
   a clock extraction circuit configured to extract an extraction clock from an interface signal with a clock signal embedded therein in a time interval indicated by the mask signal;
   a first time-delay control circuit configured to generate a compensation clock by time-delaying the extraction clock so that a phase difference between the extraction clock and the mask duplication signal becomes smaller; and a second time-delay control circuit configured to generate the first mask reference signal, and the second mask reference signal by time-delaying the compensation clock, and to generate the first mask reference signal and the second mask reference signal so that a phase of the first mask reference signal is ahead of a phase of the second mask reference signal.

2. The clock recovery device of claim 1, wherein
the mask signal generation circuit generates a rising edge of the mask signal in accordance with the first mask reference signal through a first internal circuit,
the mask duplication signal generation circuit generates a rising edge of the mask duplication signal in accordance with the second mask reference signal through a second internal circuit, and
a processing delay time of the first internal circuit and a processing delay time of the second internal circuit are substantially same.

3. The clock recovery device of claim 1, wherein one period of the interface signal is divided into a plurality of unit times in which information is divided, and the phase of the first mask reference signal is ahead of the phase of the second mask reference signal by 0.5 unit times.

4. The clock recovery device of claim 1, wherein the first time-delay control circuit comprises:
a delay circuit configured to output the compensation clock by time-delaying the extraction clock and to adjust a degree of time delay in accordance with a voltage control signal, and
a phase difference feedback circuit configured to generate the voltage control signal corresponding to the phase difference between the extraction clock and the mask duplication signal to output the voltage control signal to the delay circuit.

5. The clock recovery device of claim 1, wherein the mask signal generation circuit generates a rising edge of the mask signal in accordance with the first mask reference signal, and generates a falling edge of the mask signal in accordance with the extraction clock or a signal obtained by delaying the extraction clock by a predetermined time.

6. The clock recovery device of claim 1, wherein the second time-delay control circuit comprises:
a delay circuit configured to generate a plurality of data clock signals having different phases by time-delaying the compensation clock through a plurality of delay means connected in serial and to adjust a degree of time delay of each delay means in accordance with a voltage control signal, and
a phase difference feedback circuit configured to generate the voltage control signal corresponding to a phase difference between one data clock signal and another data clock signal through a predetermined number of the delay means in the one data clock signal to output the voltage control signal to each delay means.

7. The clock recovery device of claim 6, wherein one period of the interface signal is divided into a plurality of unit times in which information is divided, and each delay means delays the time by 0.5 unit times.

8. The clock recovery device of claim 1, wherein the interface signal includes a dummy signal interval and a clock signal interval, and a rising edge of the mask signal is located in the dummy signal interval and a falling edge thereof is located in the clock signal interval.

9. The clock recovery device of claim 8, wherein the phase of the first mask reference signal is ahead of the phase of the second mask reference signal by a time corresponding to a half of the dummy signal interval.

10. A clock recovery device comprising:
a mask signal generation circuit configured to generate a mask signal using a first mask reference signal;
a mask duplication signal generation circuit configured to generate a mask duplication signal using a second mask reference signal;
a clock extraction circuit configured to extract an extraction clock from an interface signal with a clock signal embedded therein in a time interval indicated by the mask signal;
a first time-delay control circuit configured to generate a compensation clock by time-delaying the extraction clock so that a phase difference between a signal of a portion corresponding to the clock signal in the interface signal and the mask duplication signal becomes smaller; and
a second time-delay control circuit configured to generate the first mask reference signal, and the second mask reference signal by time-delaying the compensation clock and to generate the first mask reference signal and the second mask reference signal so that a phase of the first mask reference signal is ahead of a phase of the second mask reference signal.

11. A source driver comprising:
a signal reception circuit configured to receive a display signal with a clock signal embedded therein;
a clock recovery circuit configured to generate a plurality of data clock signals by recovering the clock signal from the display signal; and
a data driving circuit configured to extract image data from the display signal in accordance with the plurality of data clock signals and to drive pixels disposed on a panel in accordance with the image data,
wherein the clock recovery circuit:
extracts an extraction clock from the display signal in a time interval indicated by a mask signal,
generates a compensation clock by time-delaying the extraction clock,
generates the plurality of data clock signals and the mask signal using the compensation clock, and
controls a time delay for the extraction clock so that a mask duplication signal delayed in time by a predetermined time with the mask signal is synchronized in phase with the extraction clock.

12. The source driver of claim 11, wherein one period of the display signal is divided into a plurality of unit times in which information is divided, and the mask duplication signal has a time delay within one unit time with the mask signal.

13. The source driver of claim 11, wherein the clock recovery circuit comprises:
a mask signal generation circuit configured to generate the mask signal in accordance with a first mask rising signal, and
a mask duplication signal generation circuit configured to generate the mask duplication signal in accordance with a second mask rising signal delayed in time by a predetermined time from the first mask rising signal.

14. The source driver of claim 13, wherein the mask duplication signal generation circuit comprises a same logic circuit as that of the mask signal generation circuit.

15. The source driver of claim 11, wherein the display signal is a serial signal, and the data driving circuit comprises a serial/parallel conversion circuit configured to convert a portion for the image data in the display signal into parallel data.

\* \* \* \* \*